US008241758B2

(12) United States Patent
Wilhelm et al.

(10) Patent No.: US 8,241,758 B2
(45) Date of Patent: *Aug. 14, 2012

(54) PLAIN BEARING COMPOSITE MATERIAL, USE THEREOF AND PRODUCTION METHODS THEREFOR

(75) Inventors: Maik Wilhelm, Ober-Olm (DE); Uwe Lehmann, Alzey (DE); Gerd Andler, Bad Schwalbach (DE); Philippe Damour, Frankfurt/Main (DE); Neil Graham, Frankfurt am Main (DE)

(73) Assignee: Federal-Mogul Weisbaden GmbH & Co. KG, Frankfurt am Main (DE)

( * ) Notice: Subject to any disclaimer, the term of this patent is extended or adjusted under 35 U.S.C. 154(b) by 300 days.

This patent is subject to a terminal disclaimer.

(21) Appl. No.: 11/914,352

(22) PCT Filed: May 13, 2006

(86) PCT No.: PCT/EP2006/004515
§ 371 (c)(1),
(2), (4) Date: Aug. 30, 2010

(87) PCT Pub. No.: WO2006/120022
PCT Pub. Date: Nov. 16, 2006

(65) Prior Publication Data
US 2010/0323218 A1      Dec. 23, 2010

(30) Foreign Application Priority Data
May 13, 2005  (DE) .................. 10 2005 023 307

(51) Int. Cl.
B32B 15/04   (2006.01)
B32B 15/08   (2006.01)
B32B 15/20   (2006.01)
F16C 33/00   (2006.01)

(52) U.S. Cl. ........ 428/626; 428/457; 428/644; 428/674; 384/42

(58) Field of Classification Search .................. None
See application file for complete search history.

(56) References Cited

U.S. PATENT DOCUMENTS

| 1,658,186 A | 2/1928 | Corson |
| 2,137,282 A | 11/1938 | Hensel et al. |
| 2,185,958 A | 1/1940 | Strang et al. |
| 2,241,815 A | 5/1941 | Hensel et al. |
| 669,334 A | 4/1952 | Ireland et al. |
| 5,209,578 A | 5/1993 | Eastham et al. |
| 5,434,012 A * | 7/1995 | Tanaka et al. ................ 428/643 |
| 5,482,782 A | 1/1996 | Tanaka et al. |
| 5,766,777 A * | 6/1998 | Tanaka et al. ................ 428/647 |
| 5,979,906 A | 11/1999 | Silvian |
| 6,143,427 A | 11/2000 | Andler |
| 6,273,972 B1 | 8/2001 | Andler |
| 6,475,635 B1 | 11/2002 | Sakai et al. |
| 2001/0016267 A1* | 8/2001 | Huhn et al. .................. 428/647 |
| 2003/0059137 A1 | 3/2003 | Kawagoe et al. |
| 2003/0099853 A1 | 5/2003 | Takayama et al. |
| 2003/0209103 A1* | 11/2003 | Takayama et al. ............... 75/231 |
| 2007/0009757 A1* | 1/2007 | Takayama et al. ............. 428/644 |
| 2009/0081471 A1* | 3/2009 | Wilhelm et al. ............... 428/457 |
| 2009/0263053 A1* | 10/2009 | Andler ............................ 384/42 |
| 2010/0068557 A1* | 3/2010 | Andler .......................... 428/677 |

FOREIGN PATENT DOCUMENTS

| AT | 389 356 B | 11/1989 |
| DE | 592708 | 2/1934 |
| DE | 1191114 | 4/1965 |
| DE | 15 58 474 A1 | 3/1970 |
| DE | 28 53 774 | 7/1980 |
| DE | 36 42 825 C1 | 1/1988 |
| DE | 4103117 C2 | 11/1993 |
| DE | 43 28 920 A1 | 4/1994 |
| DE | 43 28 921 A1 | 4/1994 |
| DE | 44 15 629 C1 | 8/1995 |
| DE | 195 25 330 A1 | 1/1997 |
| DE | 195 25 330 C2 | 7/1998 |
| DE | 19514836 C2 | 6/2000 |
| DE | 200 21 017 U1 | 2/2001 |
| DE | 102004012905 A1 | 10/2005 |
| DE | 102005007245 A1 | 5/2006 |
| GB | 2384007 | 7/2003 |

* cited by examiner

*Primary Examiner* — Jennifer McNeil
*Assistant Examiner* — Jason Savage
(74) *Attorney, Agent, or Firm* — Robert L. Sterns; Dickinson Wright, PLLC

(57) ABSTRACT

The invention relates to a plain bearing composite material with a supporting layer made of a copper alloy, and with a lining applied to the bearing metal layer. The copper alloy can contain 0.5-5% by weight of nickel, 0.2 to 2.5% by weight of silicon and=0.1% by weight of lead. The lining can be a sputtered layer that is applied without an intermediate layer. The invention also relates to methods for producing this composite material.

13 Claims, No Drawings

PLAIN BEARING COMPOSITE MATERIAL, USE THEREOF AND PRODUCTION METHODS THEREFOR

RELATED APPLICATIONS

This application is related to other applications filed on the same date herewith based on PCT/EP/2006/004505, PCT/EP/2006/004517, and based on PCT/EP/2006/004507.

BACKGROUND OF THE INVENTION

1. Technical Field

The invention relates to a plain bearing composite material and production methods therefore.

2. Related Art

Known from DE 44 15 629 C 1 is the use of a copper-nickel-silicon alloy for producing wear-resistant objects with emergency running properties such as, for example, cast pistons for pressure casting machines. The alloy described in DE 44 15 629 C1 consists of 1-4% nickel, 0.1-1.5% silicon with the remainder being copper, and is used as a solid material.

U.S. Pat. No. 2,137,282 describes an alloy comprising 0.1-30% nickel, 0.05-3% silicon and the remainder copper. Following appropriate heat treatment, this alloy is distinguished by high hardnesses and good electrical conductivities.

U.S. Pat. No. 1,658,186 describes a copper-nickel-silicon alloy, where silicides acting as hard particles are discussed in detail. Various heat treatment methods are also specified for adjusting the hardness.

Another copper-nickel-silicon alloy is found in U.S. Pat. No. 2,241,815 where the nickel fraction is 0.5-5% and the silicon fraction is 0.1-2%.

U.S. Pat. No. 2,185,958 describes alloys comprising 1% nickel, 3.5% silicon and the remainder copper as well as 1.5% silicon and 1% nickel and the remainder copper.

DE 36 42 825 C1 discloses a plain bearing material comprising 4 to 10% nickel, 1-2% aluminium, 1-3% tin and the remainder copper as well as the usual impurities, which should have a high strength and long lifetime. Solid material bushings are produced from this plain bearing material.

GB 2384007 describes a plain bearing composite material with a steel back on which a sintered layer of a copper alloy is applied, having a maximum hardness of 130 HV. The copper alloy comprises 1-11 wt. % tin, up to 0.2 wt. % phosphorus, maximum 10 wt. % nickel or silver, maximum 25 wt. % lead and bismuth.

Plain bearing composite materials in which a lining is sputtered onto a bearing metal layer are provided with intermediate layers of nickel, of a nickel alloy, of nickel-chromium, of zinc or of a zinc alloy as described in DE 43 28 921 A1. If a Cu alloy is used as the bearing alloy and if an Sn-containing alloy is used for the uppermost layer, the Sn then diffuses in the course of time into the Cu alloy, thus reducing the Sn content of the uppermost layer. At the same time, a brittle CuSn compound is formed at the compound surface, thus reducing the binding strength. In view of this, the intermediate layer of Ni or an Ni alloy is formed on the bearing alloy by spraying on or sputtering or by electroplating. The uppermost layer is then formed by vapour deposition, whereby a more stable bond can be obtained.

Diffusion barrier layers are also mentioned in DE 28 53 774.

DE 195 25 330 describes a layer material in which a bearing material is sputtered directly onto a supporting material. A steel supporting metal can be used as the supporting material to which the bearing material can be applied without an intermediate layer. However, it is also possible to use a copper-containing supporting material, in particular a supporting material comprising a copper-lead-tin alloy. For example, the supporting material can consist of CuPb22Sn.

If the lead fraction in the supporting material is of the order of magnitude of the lead fraction in the bearing material, there is no concentration gradient or only a small concentration gradient between the two materials, so that no diffusion processes can take place between the bearing material and the supporting material. If the supporting material has a higher lead concentration than the bearing material, the migration of lead to the surface of the bearing material is additionally promoted. The copper-lead-tin alloy forming the supporting material can be clad onto a steel supporting metal by casting.

SUMMARY OF THE INVENTION

It is the object of the invention to provide a plain bearing composite material with sputtered-on linings, which is comparable to the known composite material with regard to its strength and tribological properties, where diffusion barrier layers can be dispensed with regardless of the composition of the lining. It is also an object to provide a use and production methods.

DETAILED DESCRIPTION

It has been found that in the claimed copper alloys with nickel and silicon fractions, these components are diffusion-inhibiting, in particular they act on aluminium and tin so that almost no diffusion occurs. Slight diffusion can never be excluded but in this case, only an extremely thin intermediate layer is formed which does not lead to peeling of the lining applied to the copper alloy.

Further advantages of these copper alloys are that they can be adjusted over a wide range with regard to their structure and mechanical properties. It is therefore possible to adjust the strength and the mechanical properties so that the copper alloy takes over the function of the steel back which can thus be eliminated. At the same time, despite the required strength, these copper alloys possess excellent damping properties.

As a result of dispensing with the steel back, the production of the plain bearing element from such a plain bearing composite material is simplified and therefore more cost-effective.

The favourable ratio of modulus of elasticity and adjustable strength in these alloys has proved to be particularly advantageous for their use as plain bearings for highly loaded motors.

Another advantage is that the coefficients of thermal expansion of the copper alloys are of the order of magnitude of the coefficients of thermal expansion for aluminium so that plain bearing shells made of the composite material according to the invention can preferably be used in aluminium housings. At high temperatures, a good press fit is therefore ensured as before.

The strength of the copper alloy is preferably adjusted by a thermo-mechanical treatment, in particular by rolling and annealing.

The method according to the invention for producing strip material for the plain bearing composite material provides the following process steps:

Producing strip material from a copper-nickel-silicon alloy with subsequent thermo-mechanical treatment comprising the following steps:

a first annealing of the strip material at temperatures higher than 500° C. for at least 3 hours, at least one first rolling of the strip material, wherein a degree of deformation of at least 20% is implemented, at least one second annealing at temperatures higher than 500° C. and at least one second rolling of the strip material, where a degree of deformation greater than 30% is implemented.

The second annealing is preferably carried out continuously in a strip annealing plant with a strip feed rate of at least 3 m/min, in particular 3-5 m/min at temperatures >500° C.

The strength of the strip material is adjusted by means of the second rolling step, where tensile strength values of 550 to 750 MPa are preferably achieved.

The structure after the thermo-mechanical treatment is distinguished by a linear matrix structure, where fine, uniformly distributed intermetallic NiSi-based precipitations are present within this line structure.

The tensile strength values are significantly higher than those of the steel of the steel composite material which would be plastically deformed under lower loading, which leads to an increased play of the plain bearing made of the composite bearing material and to a loss of damping properties. The advantage of the copper alloys according to the invention is that the yield point can be increased to such an extent that under high loading of the bearing, the elastic properties can be retained.

The thickness of the initial strip material and the final thickness of the strip material are usually predefined. In order to be able to achieve different strength values, the first rolling is therefore preferably carried out with such degrees of deformation that the desired strength values are established during the second rolling. This means that for example, in order to achieve high strength values only a small reduction in thickness is carried out during the first rolling whereas for low strength values, high degrees of deformation are achieved during the first rolling.

Sheet bars are separated from the strip material to produce plain bearing elements following coil slitting and the sheet bars are deformed by known deforming steps to form plain bearing elements. The final process is preferably the machining of the linings and the application of the lining.

The lining is applied by means of a PVD process, in particular by means of sputtering. Optionally, a lead-in layer is also applied to the lining.

The tribological properties of the composite material are adjusted by the lining.

In the copper-nickel-silicon alloy, the nickel fraction is 0.5-5 wt. %, preferably 1.0 to 3.0 wt. %, in particular 1.5 to 2.2 wt. % and the silicon fraction is 0.2-2.5 wt. %, preferably 0.4 to 1.2 wt. % or 0.5 to 1.5 wt. %.

The copper-nickel-silicon alloy can contain 0.05-2.0 wt. % manganese, preferably 0.15-1.5 wt. %.

It has been shown that if the weight ratio of nickel to silicon is between 2.5 and 5 (nickel: silicon=2.5 to 5), the tribological properties can be improved, in particular corrosion of the bearing material can be reduced significantly. With these weight ratios the nickel-silicon compounds responsible for the good tribological properties are favoured and formed in sufficient measure.

The copper alloys can contain further micro-alloying elements. The supporting layer preferably contains 0.05-0.4 wt. %, preferably 0.075 to 0.25 wt. % of at least one micro-alloying element. Possible micro-alloying elements are, for example, chromium, titanium, zirconium, zinc and magnesium individually or in combination.

Sputtered layers preferably consist of an aluminium-tin alloy, aluminium-tin-silicon alloy, aluminium-tin-copper alloy, aluminium-tin-silicon-copper alloy or an aluminium-tin-nickel-manganese alloy.

In these alloys, the tin fraction is preferably 8-40 wt. %, the copper fraction 0.5-4.0 wt. %, the silicon fraction 0.02-5.0 wt. %, the nickel fraction 0.02-2.0 wt. % and the manganese fraction 0.02-2.5 wt. %.

It has been shown that no brittle phases which lead to peeling of the lining are formed with these sputtered layers in combination with the claimed copper alloys. An intermediate layer can thus be dispensed with, whereby considerable cost savings are achieved.

The thickness of the supporting layer is preferably 1.2-4 mm, preferably 1.3-3.5 mm, in particular 1.4-3.0 mm.

The thickness of the lining is preferably 4-30 µm, preferably 8-20 µm, in particular 10-16 µm.

The thickness of the lead-in layer is 0.2-12 µm, preferably 0.2 to 6 µm, in particular 0.2 to 3 µm.

Preferred uses of the plain bearing composite material are those for plain bearing shells.

Exemplary copper alloys are:

TABLE 1

(values in wt. %)

| | Example | | | | |
|---|---|---|---|---|---|
| | 1 | 2 | 3 | 4 | 5 |
| Ni | 1.9 | 1.5 | 0.8 | 3.8 | 2.8 |
| Si | 0.6 | 0.5 | 0.25 | 1.2 | 0.8 |
| Mn | 0.15 | 0.05 | 0.05 | 0.1 | 0.05 |
| Pb | <0.1 | <0.1 | <0.1 | <0.1 | <0.1 |
| Cr | | 0.15 | | | 0.15 |
| Ti | | | | 0.15 | |
| Zr | | | 0.2 | | 0.15 |
| Cu | Remainder | Remainder | Remainder | Remainder | Remainder |

An exemplary process provides the following process steps:

continuous casting of a copper alloy, for example double continuous casting, having a width of 300 mm and a thickness of 10 mm to produce strip material bilateral milling and subsequent winding of the strip material.

This is followed by a first annealing step in a bell-type furnace at 650° C. over 4 hours. A first rolling is then carried out with three rolling steps. In all three rolling steps, a deformation of 31% is carried out, whereby the thickness is reduced to 5.5 mm in the first rolling step, to 3.8 mm in the second rolling step and to 2.6 mm in the third rolling step.

The strip is then annealed in a strip annealing plant at 650° C. with a feed rate of 4 m/min. This is followed by a second rolling comprising a rolling step with a degree of deformation of 40%, where the thickness is reduced to 1.56 mm. This is followed by coil slitting with dimensions of 95 mm wide× 1.56 mm thick.

Examples of sputtered layers are given in Table 2.

TABLE 2

(values in wt. %)

| | Example | | | | |
|---|---|---|---|---|---|
| | 1 | 2 | 3 | 4 | 5 |
| Al | Remainder | Remainder | Remainder | Remainder | Remainder |
| Sn | 22 | 35 | 25 | 10 | 20 |
| Cu | 0.7 | 1.2 | 0.7 | 0.5 | 0.5 |

TABLE 2-continued (values in wt. %)

| | Example | | | | |
|---|---|---|---|---|---|
| | 1 | 2 | 3 | 4 | 5 |
| Si | | | 2.5 | | 1.5 |
| Mn | | | | 1.5 | |
| Ni | | | | 0.7 | 0.7 |

All of the linings can be combined with supporting layers of the copper alloys.

Lead-in layers on these layer combinations can be pure tin or indium layers as well as all said electro-plated and plastic layers, where the lead-in layer is preferably to be selected so that it is softer than the lining used.

The invention claimed is:

1. A plain bearing composite material with a supporting layer free of a further metal back, said supporting layer comprising a copper alloy containing 0.5-5 wt. % nickel, 0.2-2.5 wt. % silicon, ≦0.1 wt. % lead and the remainder copper and with a lining applied directly to the supporting layer by a PVD process.

2. The plain bearing composite material according to claim 1, wherein the copper alloy contains 0.05-2 wt. % manganese.

3. The plain bearing composite material according to claim 1, wherein the weight ratio of nickel to silicon lies between 2.5 and 5.

4. The plain bearing composite material according to claim 1, wherein the supporting layer contains 0.05-0.4 wt. % of micro-alloying elements.

5. The plain bearing composite material according to claim 4, wherein the micro-alloying elements include at least one of chromium, titanium, zirconium, zinc, magnesium, and manganese.

6. The plain bearing composite material according to claim 1, wherein the lining is applied by sputtering.

7. The plain bearing composite material according to claim 6, wherein the sputtered layer consists of aluminium-tin alloy, aluminium-tin-silicon alloy, aluminium-tin-copper alloy, aluminium-tin-silicon-copper alloy, or aluminium-tin-nickel-manganese alloy.

8. The plain bearing composite material according to claim 7, wherein said alloy includes at least one of 8-40 wt. % tin, 0.5-4.0 wt. % copper, 0.02-5.0 wt. % silicon, 0.02-2.0 wt. % nickel, and 0.02-2.5 wt. % manganese.

9. The plain bearing composite material according to claim 1, wherein a lead-in layer is provided on the lining.

10. The plain bearing composite material according to claim 9, wherein the lead-in layer consists of tin, lead, copper, indium, or plastic.

11. The plain bearing composite material according to claim 9, wherein the thickness of the lead-in layer is 0.2 to 12 µm.

12. The plain bearing composite material according to claim 1, wherein the thickness of the supporting layer is 1.2-4 mm.

13. The plain bearing composite material according to claim 1, wherein the thickness of the lining is 4-30 µm.

* * * * *